(12) United States Patent
Ono et al.

(10) Patent No.: US 11,587,958 B2
(45) Date of Patent: *Feb. 21, 2023

(54) CARRIER SUBSTRATE, LAMINATE, AND METHOD FOR MANUFACTURING ELECTRONIC DEVICE

(71) Applicant: AGC Inc., Chiyoda-ku (JP)

(72) Inventors: Kazutaka Ono, Tokyo (JP); Takatoshi Yaoita, Tokyo (JP); Reo Usui, Tokyo (JP); Kenichi Ebata, Tokyo (JP); Jun Akiyama, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/835,030

(22) Filed: Dec. 7, 2017

(65) Prior Publication Data

US 2018/0122838 A1     May 3, 2018

Related U.S. Application Data

(63) Continuation of application No. PCT/JP2016/069080, filed on Jun. 28, 2016.

(30) Foreign Application Priority Data

Jul. 3, 2015   (JP) .............................. JP2015-134697

(51) Int. Cl.
*H01L 27/12*     (2006.01)
*B32B 43/00*     (2006.01)
(Continued)

(52) U.S. Cl.
CPC ............ *H01L 27/1266* (2013.01); *B32B 7/06* (2013.01); *B32B 7/12* (2013.01); *B32B 17/00* (2013.01);
(Continued)

(58) Field of Classification Search
None
See application file for complete search history.

(56) References Cited

U.S. PATENT DOCUMENTS 5,597,395 A * 1/1997 Bocko ..................... C03B 32/00
                                                              65/111
9,902,645 B2 * 2/2018 Ono ........................ G02F 1/1333
(Continued)

FOREIGN PATENT DOCUMENTS

JP     2011-20864     2/2011
JP     2012-86527     5/2012
(Continued)

OTHER PUBLICATIONS

International Search Report dated Aug. 16, 2016 in PCT/JP2016/069080, filed on Jun. 28, 2016 (with English Translation).
(Continued)

*Primary Examiner* — David Sample
(74) *Attorney, Agent, or Firm* — Oblon, McClelland, Maier & Neustadt, L.L.P.

(57) ABSTRACT

A carrier substrate to be used, when manufacturing a member for an electronic device on a surface of a substrate, by being bonded to the substrate, includes at least a first glass substrate. The first glass substrate has a compaction described below of 80 ppm or less. Compaction is a shrinkage in a case of subjecting the first glass substrate to a temperature raising from a room temperature at 100° C./hour and to a heat treatment at 600° C. for 80 minutes, and then to a cooling to the room temperature at 100° C./hour.

35 Claims, 2 Drawing Sheets

(51) Int. Cl.
*B32B 17/00* (2006.01)
*B32B 7/12* (2006.01)
*C03C 3/091* (2006.01)
*H01L 21/683* (2006.01)
*H01L 29/786* (2006.01)
*B32B 38/10* (2006.01)
*B32B 7/06* (2019.01)
*C03C 27/10* (2006.01)
*B32B 17/06* (2006.01)
*G02F 1/1341* (2006.01)
*G02F 1/1335* (2006.01)
*G02F 1/1368* (2006.01)

(52) U.S. Cl.
CPC .............. *B32B 17/06* (2013.01); *B32B 38/10* (2013.01); *B32B 43/006* (2013.01); *C03C 3/091* (2013.01); *C03C 27/10* (2013.01); *H01L 21/6835* (2013.01); *H01L 27/1222* (2013.01); *H01L 29/78672* (2013.01); *B32B 2307/30* (2013.01); *B32B 2307/308* (2013.01); *B32B 2307/546* (2013.01); *B32B 2307/734* (2013.01); *B32B 2315/08* (2013.01); *B32B 2457/00* (2013.01); *G02F 1/1341* (2013.01); *G02F 1/1368* (2013.01); *G02F 1/13415* (2021.01); *G02F 1/133516* (2013.01); *G02F 2202/104* (2013.01); *H01L 27/1274* (2013.01); *H01L 2221/6835* (2013.01); *H01L 2221/68386* (2013.01)

(56) References Cited

U.S. PATENT DOCUMENTS

| | | | | |
|---|---|---|---|---|
| 10,822,264 | B2* | 11/2020 | Takiguchi | C03B 25/08 |
| 11,053,160 | B2* | 7/2021 | Tokunaga | C03C 3/091 |
| 11,414,339 | B2* | 8/2022 | Tokunaga | G02F 1/1333 |
| 2007/0191207 | A1* | 8/2007 | Danielson | C03C 3/091 |
| | | | | 501/66 |
| 2008/0135175 | A1 | 6/2008 | Higuchi | |
| 2010/0126221 | A1* | 5/2010 | Danielson | C03B 17/067 |
| | | | | 65/95 |
| 2011/0265516 | A1* | 11/2011 | Allan | C03C 3/085 |
| | | | | 65/29.19 |
| 2012/0156480 | A1 | 6/2012 | Kondo et al. | |
| 2014/0038807 | A1* | 2/2014 | Tsujimura | C03C 3/091 |
| | | | | 501/66 |
| 2014/0179510 | A1* | 6/2014 | Allan | C03C 3/093 |
| | | | | 501/67 |
| 2015/0087495 | A1* | 3/2015 | Nishizawa | C03C 3/093 |
| | | | | 501/67 |
| 2015/0299028 | A1* | 10/2015 | Nishizawa | C03C 3/091 |
| | | | | 501/66 |
| 2017/0345699 | A1* | 11/2017 | Katayama | C03B 17/06 |

FOREIGN PATENT DOCUMENTS

| | | | |
|---|---|---|---|
| JP | 2014-43356 | 3/2014 | |
| KR | 2013-0085018 | 7/2013 | |
| WO | WO 2007/018028 A1 | 2/2007 | |
| WO | WO 2011/024775 A1 | 3/2011 | |
| WO | WO-2014087971 A * | 6/2014 | ............ C03C 3/091 |
| WO | WO-2014208523 A1 * | 12/2014 | ............ C03C 3/091 |
| WO | WO-2014208524 A1 * | 12/2014 | ............ C03C 3/091 |
| WO | WO 2016/111152 A1 | 7/2016 | |

OTHER PUBLICATIONS

Written Opinion dated Aug. 16, 2016 in PCT/JP2016/069080, filed on Jun. 28, 2016.

* cited by examiner

CARRIER SUBSTRATE, LAMINATE, AND METHOD FOR MANUFACTURING ELECTRONIC DEVICE

TECHNICAL FIELD

The present invention relates to a carrier substrate and, in particular, to a carrier substrate including a glass substrate exhibiting a predetermined compaction.

In addition, the present invention also relates to a laminate including the carrier substrate described above and a method for manufacturing an electronic device.

BACKGROUND ART

In recent years, devices (electronic devices) such as photovoltaic batteries (PV), liquid crystal display panels (LCD), and organic EL display panels (OLED) have become thinner and lighter, and the glass substrates used for these devices have been made thinner. When the strength of the glass substrate is insufficient due to thinning, handleability of the glass substrate in the device manufacturing steps deteriorates.

Recently, a method for coping with the problem described above was proposed in which a glass laminate in which a glass substrate and a carrier substrate are laminated is prepared and a member for an electronic device such as a display device is formed on the glass substrate of the laminate, and then the carrier substrate is separated from the glass substrate (for example, PTL 1). Reusing the separated carrier substrate as a carrier substrate for manufacturing a display device was also considered.

CITATION LIST

Patent Literature

PTL 1: WO 2007/018028

SUMMARY OF INVENTION

Technical Problem

Meanwhile, recently, with demands for higher performance of electronic devices, it is desired to perform processing under higher temperature conditions (for example, 500° C. or more) when manufacturing electronic devices. In addition, as described above, it is desirable that the carrier substrate is reused a plurality of times.

The present inventors examined the manufacturing of an electronic device by repeatedly using the carrier substrate described in PTL 1 in the manufacturing of an electronic device involving a high temperature treatment. Specifically, repeated high temperature treatment of a glass substrate was simulated by using computer simulation assuming such a process is performed that a laminate including the carrier substrate described in PTL 1 is applied to the manufacturing of an electronic device involving a high temperature treatment and then the carrier substrate is peeled and the carrier substrate is reused to manufacture an electronic device.

As a result, in a case where the electronic device is manufactured by reusing the carrier substrate, it was found that there is a concern that pattern shifting or the like is likely to occur in the electronic device and the yield of the electronic device may be lowered.

The present invention is made in view of the above problems and an object thereof is to provide a carrier substrate for which, even when reused a plurality of times to manufacture electronic devices, the manufacturing yield of the electronic device is excellent.

In addition, another object of the present invention is to provide a laminate including the carrier substrate described above, and a method for manufacturing an electronic device using the laminate.

Solution to Problem

As a result of intensive research to solve the problem described above, the present inventors found that it is possible to solve the problems described above by using a carrier substrate including a glass substrate exhibiting a predetermined compaction, and completed the present invention.

That is, a first aspect of the present invention is a carrier substrate to be used, when manufacturing a member for an electronic device on a surface of a substrate, by being bonded to the substrate, the carrier substrate including at least a first glass substrate, in which the first glass substrate has a compaction described below of 80 ppm or less.

Compaction: a shrinkage in a case of subjecting the first glass substrate to a temperature raising from a room temperature at 100° C./hour and to a heat treatment at 600° C. for 80 minutes, and then to a cooling to the room temperature at 100° C./hour.

In addition, in the first aspect, the compaction is preferably 70 ppm or less.

In addition, in the first aspect, the first glass substrate preferably has a strain point of 700° C. or more.

In addition, in the first aspect, the first glass substrate preferably includes a glass containing, in terms of mass percentages based on oxides, the following: $SiO_2$: 50% to 73%
$Al_2O_3$: 10.5% to 24%
$B_2O_3$: 0% to 5%
MgO: 0% to 10%
CaO: 0% to 14.5%
SrO: 0% to 24%
BaO: 0% to 13.5%
MgO+CaO+SrO+BaO: 8% to 29.5%

In addition, the first aspect preferably further includes an adhesive layer arranged on the first glass substrate.

A second aspect of the present invention is a laminate including the carrier substrate according to the first aspect; and a substrate arranged on the carrier substrate. In addition, in the second aspect, the substrate is preferably a second glass substrate.

A third aspect of the present invention is a method for manufacturing an electronic device, including a member forming step of forming a member for an electronic device on a surface of the substrate of the laminate according to the second aspect to obtain a member for an electronic device-attached-laminate; and a separating step of removing the carrier substrate from the member for an electronic device-attached-laminate to obtain an electronic device having the substrate and the member for an electronic device.

In addition, in the third aspect, the member for an electronic device preferably includes a low-temperature polysilicon (LTPS).

In addition, the third aspect preferably further includes a step having a process temperature of 450° C. or more in forming the member for an electronic device.

Advantageous Effects of Invention

According to the present invention, it is possible to provide a carrier substrate for which, even when reused a plurality of times to manufacture electronic devices, the manufacturing yield of the electronic device is excellent.

In addition, according to the present invention, it is also possible to provide a laminate including the carrier substrate and a method for manufacturing an electronic device using the laminate.

DESCRIPTION OF EMBODIMENTS

A description will be given below of embodiments for carrying out the present invention with reference to the drawings; however, the present invention is not limited to these following embodiments, and various modifications and substitutions to the following embodiments are possible within a range not departing from the scope of the present invention.

One of the characteristics of the carrier substrate of the present invention is the point of including a glass substrate exhibiting predetermined compaction.

The present inventors studied the reason why the yield of the electronic device decreases when the carrier substrate is reused a plurality of times, and found that the yield is influenced by the heat shrinkage (compaction) of the carrier substrate.

First, manufacturing an electronic device usually includes a process of forming a fine pattern by using a mask. The shape of the mask (the size of the opening) is often formed in consideration of the heat shrinkage of the workpiece during the heat treatment. Therefore, when an electronic device is manufactured by using a laminate including a carrier substrate, the shape of the mask is designed based on the size of the laminate heat-shrunk in the first manufacturing of the electronic device.

The present inventors found that after manufacturing an electronic device by using a carrier substrate including a glass substrate (AN100 manufactured by Asahi Glass Co., Ltd.) which is a support plate described in PTL 1, when manufacturing an electronic device by using the carrier substrate again, since the carrier substrate further undergoes heat shrinkage, pattern deviation is likely to occur when an electronic device is manufactured by using the already manufactured mask. In other words, it was found that the substrate arranged thereon also shrinks due to the heat shrinkage of the carrier substrate, resulting in positional shifting of the pattern to be formed, thereby lowering the manufacturing yield of the electronic device.

The present inventors found the above cause and examined solution methods thereof and, as a result, found that when a glass substrate having a predetermined compaction value when processed under predetermined heating conditions is used, even in the second time of manufacturing an electronic device and thereafter, it is possible to suppress the heat shrinkage of the glass substrate (in other words, the carrier substrate), and as a result, the manufacturing yield of the electronic device is excellent.

Figure 1:
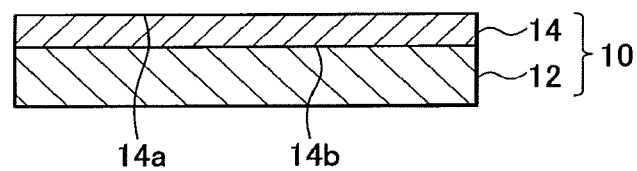
FIG. 1 is a schematic cross-sectional view of one embodiment of a carrier substrate according to the present invention.

The carrier substrate of the present invention may have at least a first glass substrate having predetermined characteristics, but the carrier substrate illustrated in FIG. 1 is preferably used. FIG. 1 is a schematic cross-sectional view of a carrier substrate according to a first embodiment of the present invention.

As illustrated in FIG. 1, the carrier substrate 10 is a laminate having a first glass substrate 12 and an adhesive layer 14 arranged on the first glass substrate 12. In the adhesive layer 14, a surface 14b is in contact with the first main surface of the first glass substrate 12, and no other material is in contact with a surface 14a.

Figure 2:
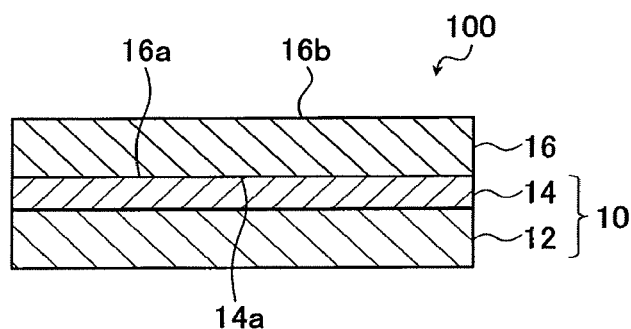
FIG. 2 is a schematic cross-sectional view of one embodiment of a laminate according to the present invention.

In general, as illustrated in FIG. 2, the carrier substrate 10 is laminated such that the surface 14a of the adhesive layer 14 and a substrate 16 are in contact with each other, so as to be used in a member forming step of manufacturing a member for an electronic device such as a liquid crystal panel on the substrate 16.

FIG. 2 is a schematic cross-sectional view of one embodiment of the laminate according to the present invention.

As illustrated in FIG. 2, a laminate 100 is a laminate having a layer of the first glass substrate 12, a layer of the substrate 16, and the adhesive layer 14 present therebetween. One surface of the adhesive layer 14 is in contact with the layer of the first glass substrate and the other surface thereof is in contact with a first main surface 16a of the substrate 16. Here, the substrate 16 is peelably laminated on the adhesive layer 14.

The carrier substrate 10 formed of the first glass substrate 12 and the adhesive layer 14 functions as a reinforcing plate for reinforcing the substrate 16 in a member forming step of manufacturing a member for an electronic device such as a liquid crystal panel.

The laminate 100 is used up to a member forming step to be described below. That is, the laminate 100 is used until a member for an electronic device such as a liquid crystal display device is formed on a second main surface 16b of the substrate 16. Thereafter, the laminate on which the member for an electronic device is formed is separated into the carrier substrate 10 and a member-attached-substrate, and the carrier substrate 10 is not a portion which forms the electronic device. A new substrate 16 is laminated on the carrier substrate 10 and the result is able to be reused as a new laminate 100.

Here, the adhesive layer 14 is fixed on the first glass substrate 12 and the substrate 16 is peelably laminated (adhered) on the adhesive layer 14 of the carrier substrate 10. In the present invention, fixing and peelably laminating (adhering) are different in peel strengths (that is, the stress required for peeling) and fixing means that the peel strength is greater than that of the adhering. In other words, the peel strength at the interface between the adhesive layer 14 and the first glass substrate 12 is larger than the peel strength at the interface between the adhesive layer 14 and the substrate 16. That is to say that peelable lamination (adhesion) means that peeling is possible and that the peeling is possible without causing a peeling at the fixed surface.

More specifically, when the interface between the first glass substrate 12 and the adhesive layer 14 has a peel strength (x) and stress is applied in the peeling direction exceeding the peel strength (x) at the interface between the first glass substrate 12 and the adhesive layer 14, the interface between the first glass substrate 12 and the adhesive layer 14 is peeled. When the interface between the adhesive layer 14 and the substrate 16 has a peel strength (y) and stress is applied in the peeling direction exceeding the peel strength (y) at the interface between the adhesive layer 14 and the substrate 16, the interface between the adhesive layer 14 and the substrate 16 is peeled.

In the laminate 100 (which also means the member for an electronic device-attached-laminate described below), the peel strength (x) is higher than the peel strength (y). Accordingly, when stress is applied to the laminate 100 in a direction to separate the first glass substrate 12 and the substrate 16, the laminate 100 is peeled at the interface between the adhesive layer 14 and the substrate 16 to separate into the substrate 16 and the carrier substrate 10.

The peel strength (x) is preferably sufficiently higher than the peel strength (y). Increasing the peel strength (x) means that the adhesive force of the adhesive layer 14 to the first glass substrate 12 is increased, and it is possible to maintain a higher adhesive force relative to that to the substrate 16 after the heat treatment.

A method for increasing the adhesive force of the adhesive layer 14 to the first glass substrate 12 is not particularly limited and examples thereof include, as described below, a method of curing the curable resin on the first glass substrate 12 to form the predetermined adhesive layer 14. It is possible to form the adhesive layer 14 bonded to the first glass substrate 12 with high bonding force by using the adhesive force during curing. On the other hand, the bonding force of the adhesive layer 14 to the substrate 16 is usually lower than the bonding force generated at the time of curing. Accordingly, carrying out a curing treatment (heat treatment) on the curable resin layer on the first glass substrate 12 to form the adhesive layer 14 and then laminating the substrate 16 on the surface of the adhesive layer 14 makes it possible to manufacture the laminate 100 which satisfies the desired peeling relationship.

In FIG. 1, the carrier substrate having the first glass substrate and the adhesive layer is illustrated in detail, but the present invention is not limited to this embodiment, and an adhesive layer may not be provided as long as it is possible to peelably laminate the substrate. That is, the carrier substrate may be one formed of a first glass substrate.

Figure 3:
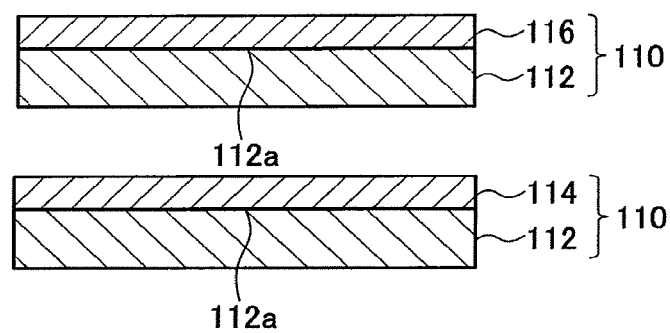
FIG. 3 is a schematic cross-sectional view of another embodiment of the laminate according to the present invention.

In the case of this embodiment, as illustrated in FIG. 3, a substrate 116 is arranged on a first glass substrate 112 to form a laminate 110.

In the present embodiment, the surface roughness (Ra) of the surface (a surface 112a in FIG. 3) on the side of the first glass substrate 112 in contact with the substrate 116 is preferably 2.0 nm or less, and more preferably 1.0 nm or less. The lower limit value is not particularly limited, but 0 is the most preferable. In the range described above, adhesion with the substrate 116 is further improved, it is possible to further suppress positional shifting of the substrate 116 and the like, and the substrate 116 is also excellent in peelability.

The surface roughness (Ra) is measured according to JIS B 0601 (revised 2001).

A detailed description will be given below of each layer (the first glass substrate 12, the substrate 16, the adhesive layer 14) forming the carrier substrate 10 and the laminate 100, and thereafter a detailed description will be given of the method for manufacturing a carrier substrate, a laminate, and a member-attached-substrate.

Since the first glass substrate 112 and the substrate 116 in the laminate 110 have the same structure as the first glass substrate 12 and the substrate 16, description thereof is omitted.

<First Glass Substrate 12>

The first glass substrate 12 supports and reinforces the substrate 16 and, in a member forming step (step of manufacturing a member for an electronic device) described below, prevents deformation, scratching, breaking, or the like of the substrate 16 when manufacturing the member for an electronic device.

The first glass substrate 12 is a glass substrate having a compaction (compaction value) of 80 ppm or less in a case of a heat treatment at 600° C. for 80 minutes. Here, in terms of a superior manufacturing yield of electronic devices (also simply referred to below as "the effect of the present invention is superior"), the compaction is preferably 70 ppm or less, more preferably 60 ppm or less, and even more preferably 50 ppm or less. The lower limit is not particularly limited, but is often 20 ppm or more due to the characteristics of the glass.

In a case where the compaction exceeds 80 ppm, the manufacturing yield of the electronic device is inferior.

The compaction described above is the glass heat shrinkage generated by relaxation of the glass structure during heat treatment. In the present invention, the compaction means the shrinkage (ppm) of the indentation interval distance in a case of stamping two indentations at predetermined intervals on the surface of a glass substrate, then heating the glass substrate to raise the temperature from room temperature to 600° C. at 100° C./hour, maintaining it at 600° C. for 80 minutes, and then cooling it to room temperature at 100° C./hour.

It is possible to measure the compaction in the present invention by the following method.

The surface of the glass substrate is polished to obtain a 100 mm×20 mm sample. Point-like indentations are stamped on the surface of the sample at two positions in the long-side direction at an interval A (A=95 mm).

Next, the sample is heated from room temperature to 600° C. at a temperature-raising rate of 100° C./hour (=1.6° C./min), held at 600° C. for 80 minutes, and then cooled to room temperature at a temperature-lowering rate of 100° C./hour. Then, the distance between the indentations is measured again, and this distance is taken as B. The compaction is calculated from A and B obtained in this manner using the following equation. Here, A and B are measured by using an optical microscope.

$$\text{Compaction [ppm]} = (A-B)/A \times 10^6$$

Although the range of the strain point of the first glass substrate 12 is not particularly limited, it is preferably 700° C. or more, and more preferably 710° C. or more, from the viewpoint of the superior effects of the present invention. However, since a problem occurs in glass molding when the strain point is excessively high, it is preferably 770° C. or less. It is more preferably 760° C. or less, and even more preferably 750° C. or less.

The strain point is a temperature at which a viscous flow of glass is practically impossible, corresponds to the lower limit temperature in the slow cooling range, and is a temperature at which the viscosity corresponds to $10^{14.5}$ dPa·s {poise}. The strain point is measured by using the fiber elongation method set out in JIS-R 3103 (2001) and ASTM-C 336 (1971).

The composition of the first glass substrate 12 is not particularly limited, but in terms of the superior effect of the present invention, the glass matrix composition is preferably in the following range in terms of mass percentage based on oxides.

$SiO_2$: 50% to 73%
$Al_2O_3$: 10.5% to 24%
$B_2O_3$: 0% to 5%
MgO: 0% to 10%
CaO: 0% to 14.5%
SrO: 0% to 24%
BaO: 0% to 13.5%
MgO+CaO+SrO+BaO: 8% to 29.5%

Next, a description will be given of the composition range of each component.

When $SiO_2$ is less than 50% (in terms of mass percentage based on oxides, the same applies below unless otherwise specified), the strain point does not rise sufficiently and the thermal expansion coefficient increases and the density rises, thus 50% or more is preferable. It is more preferably 53% or more, even more preferably 55% or more, and particularly preferably 57% or more. When it exceeds 73%, the meltability decreases and the defoaming property decreases, thus it is preferably 73% or less. It is more preferably 70% or less, even more preferably 67% or less, and particularly preferably 65% or less.

Although $Al_2O_3$ suppresses the phase separation property of the glass, decreases the coefficient of thermal expansion, and raises the strain point, this effect does not appear at below 10.5%, and other components which increase expansion are increased, thus, the thermal expansion becomes large as a result. It is preferably 10.5% or more, more preferably 15% or more, and even more preferably 17% or more. When it exceeds 24%, there is a concern that the meltability of the glass may deteriorate and the devitrification temperature may rise, thus it is preferably 24% or less, and more preferably 22% or less.

$B_2O_3$ improves the dissolution reactivity of the glass and lowers the devitrification temperature and thus is able to be added at 0% or more and 5% or less. In order to obtain the above effects, it is preferably 0.1% or more. However, when it is excessive, the strain point becomes low. Therefore, it is preferably 5% or less, and more preferably 3% or less.

MgO has the characteristics of not increasing expansion among alkaline earths and not excessively lowering the strain point and also improves meltability.

Here, the MgO content is preferably 0% or more and 10% or less, and more preferably 1% or more. When it exceeds 10%, there is a concern that the devitrification temperature may rise, thus it is preferably 10% or less, more preferably 7% or less, and even more preferably 6% or less.

CaO has a characteristic of not increasing the expansion among the alkaline earths next to MgO and not excessively lowering the strain point and also improves meltability.

Here, the CaO content is preferably 0% or more and 14.5% or less, more preferably 1% or more, and even more preferably 3% or more. When it exceeds 14.5%, there is a concern that the devitrification temperature may rise. It is more preferably 10% or less, and even more preferably 7% or less.

SrO is an optional component which improves meltability without increasing the devitrification temperature of the glass.

Here, the SrO content is preferably 0% or more and 24% or less, and more preferably 1% or more. When it exceeds 24%, there is a concern that the expansion coefficient may increase. It is more preferably 12% or less, and even more preferably 9% or less.

Although BaO is not essential, it can be included to improve the meltability and to improve the devitrification resistance. However, when it is excessive, the expansion and density of the glass increase excessively, thus, it is preferably 13.5% or less, more preferably 12% or less, and even more preferably 10% or less.

Here, in a case where the density is a problem in particular, the BaO content should be small, preferably 5% or less, preferably 1% or less, more preferably 0.5% or less, and particularly preferably substantially not contained. The expression "substantially not contained" means not contained other than unavoidable impurities.

On the other hand, in a case where importance is given to the devitrification resistance, it is preferably 1% or more, more preferably 3% or more, and even more preferably 5% or more.

When the total amount of MgO, CaO, SrO, and BaO is less than 8%, the meltability is poor. It is preferably 8% or more, and more preferably 10% or more. It is even more preferably 12% or more, and particularly preferably 14% or more. When it exceeds 29.5%, there is a concern of causing a problem that the thermal expansion coefficient cannot be made small, thus it is preferably 29.5% or less, more preferably 25% or less, even more preferably 23% or less, and particularly preferably 21% or less.

As other components, it is possible to add components for adjusting the physical properties and fining agents as long as the features of the present invention are not impaired. Examples of components for adjusting the physical properties include $Fe_2O_3$, ZnO, $ZrO_2$, $TiO_2$, $Nb_2O_5$, $Ta_2O_5$, $Y_2O_3$, $La_2O_3$, $Gd_2O_3$, and $P_2O_5$, and examples of fining agents include $SnO_2$, $SO_3$, Cl, F, and the like. In each case, it is possible for the above to be contained in the range of less than 1%.

Alkali metal oxides such as $Li_2O$, $Na_2O$ and $K_2O$ may be mixed as unavoidable impurities of raw materials or added to promote melting. These cause contamination by alkali ions in the TFT manufacturing step, and as a result, there is a possibility of causing the TFT characteristics to deteriorate. Therefore, it is preferable that the content thereof is as little as possible. Specifically, they are preferably 0.1% or less. They are more preferably 0.08% or less, even more preferably 0.05% or less, and particularly preferably 0.03% or less.

Since $As_2O_3$, PbO and CdO adversely affect the environment, these components are substantially not contained.

It is preferable that the glass used for the first glass substrate 12 or the first glass substrate 112 has a high Young's modulus in order to reduce bending during transport of the laminated substrate. It is preferably 77 GPa or more, more preferably 80 GPa or more, and particularly preferably 82 GPa or more.

In addition, if the glass used for the first glass substrate 12 or the first glass substrate 112 is scratched, when the recycling is performed, there is a possibility that the strength will be reduced or unevenness will occur in ultraviolet irradiation described below. Therefore, it is preferable that the Vickers hardness of the glass of the first glass substrate 12 or the first glass substrate 112 is high. It is preferably 580 or more, more preferably 590 or more, and even more preferably 600 or more.

The step of manufacturing an electronic device such as a liquid crystal display or an OLED display using the glass used for the first glass substrate 12 or the first glass substrate 112 may include a step of irradiating with, for example, ultraviolet light through the first glass substrate 12 so as to cure the liquid crystal alignment film or destroy the bond at the resin-glass interface and facilitate peeling. Therefore, it is preferable that the glass has high ultraviolet transmittance. The external transmittance (transmittance including reflection on the front and back surfaces) of 300 nm is preferably 40% or more in terms of 0.5 mm thickness conversion. It is more preferably 50% or more, even more preferably 60% or more, and particularly preferably 70% or more.

The thickness of the first glass substrate 12 may be thicker or thinner than the substrate 16, but is often thinner than the substrate 16. The thickness of the first glass substrate 12 is preferably selected based on the thickness of the substrate 16, the thickness of the adhesive layer 14, and the thickness of the laminate 100. For example, in a case where a current member forming step is designed to process a substrate having a thickness of 0.5 mm and the sum of the thickness of the substrate 16 and the thickness of the adhesive layer 14 is 0.1 mm, the thickness of the first glass substrate 12 is set to 0.4 mm. In a typical case, the thickness of the first glass substrate 12 is preferably 0.2 to 0.5 mm, and is preferably thicker than the substrate 16.

The method for manufacturing the first glass substrate 12 is not particularly limited, as long as a glass substrate exhibiting the compaction described above can be obtained. Among such methods, in view of easy adjustment of compaction, a manufacturing method having a melting step of dissolving a glass raw material to obtain molten glass, a forming step of forming the molten glass obtained by the melting step into a plate-like glass ribbon, and a slow cooling step of gradually cooling the glass ribbon formed in the forming step is preferable.

In the melting step, the glass raw material is melted to obtain molten glass. For example, a glass raw material is prepared so as to obtain a composition of the glass plate to be obtained, the glass raw material is continuously charged into a melting furnace, and heated to about 1450 to 1650° C. to obtain molten glass.

In the forming step, the molten glass obtained by the melting step is formed into a plate-like glass ribbon (ribbon-shaped glass plate). More specifically, it is formed into a glass ribbon having a predetermined thickness by a float method or a fusion method.

In the slow cooling step, the plate-like glass ribbon obtained by the forming step is gradually cooled. In order to adjust to the compaction in the predetermined range described above, a method of controlling the cooling rate in this slow cooling step is preferable. It is possible to adjust the average cooling rate in a range of, for example, 15 to 600° C./min. It is preferably 20 to 400° C./min, more preferably 30 to 300° C./min, and even more preferably 30 to 100° C./min, from the viewpoint of the superior effect of the present invention.

Here, in a case where the surface temperature of the ribbon-shaped glass plate is TH (° C.), room temperature is TL (° C.), and the time until the surface temperature of the ribbon-shaped glass plate is cooled from TH to TL is t (min), the average cooling rate is the rate indicated by (TH-TL)/t.

In addition, the specific cooling means is not particularly limited, and may be a cooling method known in the related art. Examples thereof include a method using a heating furnace having a temperature gradient.

<Substrate>

In the substrate 16, the first main surface 16a is in contact with the adhesive layer 14 and the member for an electronic device is provided on the second main surface 16b on the opposite side to the adhesive layer 14 side. That is, the substrate 16 is a substrate used for forming an electronic device described below.

The type of the substrate 16 is not particularly limited, and examples thereof include a glass substrate, a resin substrate, a metal substrate, and the like.

In a case where a glass substrate (also referred to below as a second glass substrate) is used as the substrate 16, the type of the second glass substrate may be a general one and examples thereof include a glass substrate for a display device such as an LCD or an OLED. The second glass substrate is excellent in chemical resistance and moisture permeation resistance and has a low heat shrinkage. As an index of the heat shrinkage, the coefficient of linear expansion specified in JIS R 3102 (revised 1995) is used.

The second glass substrate is obtained by melting the glass raw material and forming the molten glass into a plate shape. The forming method may be a general method, and for example, a float process, a fusion process, a slot down draw process, or the like is used. In addition, it is also possible to form and obtain the second glass substrate, which has a particularly small thickness, with a method of heating a glass temporarily formed into a plate shape to a formable temperature and thinning by stretching with a means such as stretching (a redraw method).

The type of the glass of the second glass substrate is not particularly limited, but an oxide-based glass containing silicon oxides as a main component, such as alkali-free borosilicate glass, borosilicate glass, soda-lime glass, high silica glass, and the like is preferable. As the oxide-based glass, a glass having a silicon oxide content of 40 to 90% by mass in terms of oxide is preferable.

As the glass of the second glass substrate, a glass suitable for the type of member for an electronic device and manufacturing steps thereof is adopted. For example, a glass substrate for a liquid crystal panel is formed of a glass (alkali-free glass) substantially not including alkali metal components (provided that alkaline earth metal components are normally included) since the dissolution of alkali metal components is likely to affect the liquid crystal. In this manner, the glass of the second glass substrate is appropriately selected based on the type of the device to be applied thereto and the manufacturing steps thereof. Here, "substantially not including alkali metal components" means that the content of the alkali metal components is 0.1% by mass or less.

In a case where a resin substrate is used as the substrate 16 or the substrate 116, the type of resin constituting the resin substrate is not particularly limited, but a polyimide resin is preferable from the viewpoint of heat resistance.

From the viewpoint of reducing the thickness and/or weight of the substrate 16, the thickness of the substrate 16 is preferably 0.3 mm or less, more preferably 0.15 mm or less, and even more preferably 0.10 mm or less. In a case where it is 0.3 mm or less, it is possible to impart good flexibility to the substrate 16. In a case where it is 0.15 mm or less, it is possible to wind the substrate 16 into a roll shape.

In addition, the thickness of the substrate 16 is preferably 0.03 mm or more for reasons such as ease of manufacturing of the substrate 16 and ease of handling of the substrate 16.

In a case where a resin substrate such as polyimide is used, there is a method in which a polyimide precursor is directly coated on the first glass substrate 112 and a heat treatment is performed at a high temperature of 400° C. to 500° C. to conduct curing. In this case, the thickness of the substrate 116 is preferably 0.1 mm or less, and more preferably 0.05 mm or less. On the other hand, it is preferably 0.001 mm or more, more preferably 0.005 mm or more, and even more preferably 0.01 mm or more, in order to maintain the strength when peeled as a device.

Furthermore, the glass of the first glass substrate 112 in a case where the device is manufactured by such steps is required to have high ultraviolet transmittance. This is for irradiating with ultraviolet rays from the side of the first glass substrate 112 when peeling the substrate 116 directly formed on the first glass substrate 112. Therefore, regardless of plate thickness, as an external transmittance at a wavelength of 300 nm, the ultraviolet transmittance of the glass of the first glass substrate 112 is preferably 40% or more, more preferably 50% or more, even more preferably 60% or more, and particularly preferably 70% or more.

The plate thickness of the first glass substrate 112 is not particularly limited, but when the plate thickness becomes excessively thin, deflection becomes large and problems occur in transportation, and thus it is preferably 0.4 mm or more, and more preferably 0.5 mm or more. On the other hand, it is excessively thick, the weight of the substrate becomes excessively large and the load of the conveying device becomes large, and thus it is preferably 1.0 mm or less, and more preferably 0.7 mm or less.

<Adhesive Layer>

The adhesive layer 14 prevents positional shifting of the substrate 16 until the operation of separating the substrate 16 and the first glass substrate 12 is performed and prevents breakage of the substrate 16 and the like due to a separation operation. The surface 14a of the adhesive layer 14 in contact with the substrate 16 is peelably laminated (adhered) on the first main surface 16a of the substrate 16. As described above, the adhesive layer 14 is bonded to the first main surface 16a of the substrate 16 with a weak bonding force, and the peel strength (y) of the interface thereof is lower than the peel strength (x) of the interface between the adhesive layer 14 and the first glass substrate 12.

That is, when separating the substrate 16 and the first glass substrate 12, peeling is performed at the interface between the first main surface 16a of the substrate 16 and the adhesive layer 14 and peeling is hardly performed at the interface between the first glass substrate 12 and the adhesive layer 14. Therefore, the adhesive layer 14 has a surface characteristic in which it is in close contact with the first main surface 16a of the substrate 16 and it allows easy peeling of the substrate 16. That is, the adhesive layer 14 is bonded to the first main surface 16a of the substrate 16 with a certain degree of bonding force to prevent positional shifting of the substrate 16 or the like and, at the same time, bonded with a bonding force to such an extent that the substrate 16 is able to be easily peeled without the substrate 16 being destroyed when peeling it. In the present invention, the property of the surface of the adhesive layer 14 of being able to be easily peeled is referred to as peelability. On the other hand, the first main surface of the first glass substrate 12 and the adhesive layer 14 are bonded to each other with a bonding force at which separation is relatively difficult.

The type of the adhesive layer 14 is not particularly limited and may be an organic layer composed of a resin or the like, or an inorganic layer. Each case will be described in detail below.

(Organic Layer)

The organic layer is preferably a resin layer that includes a predetermined resin. The type of resin forming the resin layer is not particularly limited, and examples thereof include a silicone resin, a polyimide resin, an acrylic resin, a polyolefin resin, a polyurethane resin, a fluorine-based resin, and the like. It is also possible to mix and use several types of resins. Among these, a silicone resin, a polyimide resin, and a fluorine-based resin are preferable.

The silicone resin is a resin which includes a predetermined organosiloxy unit and is generally obtained by curing a curable silicone. The curable silicones are classified into addition reaction type silicones, condensation reaction type silicones, ultraviolet curing type silicones, and electron beam curing type silicones according to the curing mechanism thereof, and it is possible to use any of these. Among these, addition reaction type silicones or condensation reaction type silicones are preferable.

As the addition reaction type silicone, it is possible to suitably use a curable composition which includes a main agent and a cross-linking agent and which is curable in the presence of a catalyst such as a platinum-based catalyst. The curing of the addition reaction type silicone is promoted by a heat treatment. The main agent in the addition reaction type silicone is preferably an organopolysiloxane having an alkenyl group (such as a vinyl group) bonded to a silicon atom (that is, an organoalkenylpolysiloxane, preferably straight-chain form), and an alkenyl group or the like serves as a cross-linking point. The cross-linking agent in the addition reaction type silicone is preferably an organopolysiloxane having a hydrogen atom (a hydrosilyl group) bonded to a silicon atom (that is, an organohydrogenpolysiloxane, preferably straight-chain form), and a hydrosilyl group or the like serves as a cross-linking point.

The addition reaction type silicone is cured by the addition reaction of the cross-linking points of the main agent and the cross-linking agent. From the viewpoint of superior heat resistance derived from the cross-linked structure, the molar ratio of hydrogen atoms bonded to silicon atoms of the organohydrogenpolysiloxane with respect to the alkenyl groups of the organoalkenylpolysiloxane is preferably 0.5 to 2.

In the case of using an addition reaction type silicone, a catalyst (in particular, a platinum group metal-based catalyst) may be further used, if necessary.

The platinum group metal-based catalyst (platinum group metal catalyst for hydrosilylation) is a catalyst for promoting and accelerating the hydrosilylation reaction between the alkenyl group in the organoalkenyl polysiloxane and the hydrogen atom in the organohydrogenpolysiloxane. Examples of the platinum group metal-based catalyst include platinum-based catalysts, palladium-based catalysts, and rhodium-based catalysts, in particular, the use as platinum-based catalysts is preferable from the viewpoint of economy and reactivity.

As the condensation reaction type silicone, it is possible to suitably use a hydrolyzable organosilane compound as a monomer or a mixture thereof (monomer mixture) or a partially hydrolyzed condensate (organopolysiloxane) obtained by subjecting a monomer or monomer mixture to a partial hydrolytic condensation reaction.

By using this condensation reaction type silicone and allowing a hydrolysis/condensation reaction (sol-gel reaction) to proceed, a silicone resin can be formed.

The polyimide resin is a resin having an imide structure and a resin obtained by a reaction of tetracarboxylic acids and diamines.

Although the structure of the polyimide resin is not particularly limited, it is preferably formed of a repeating unit having a residue (X) of a tetracarboxylic acid and a residue (A) of a diamine represented by Formula (1) below.

[Chem. 1]

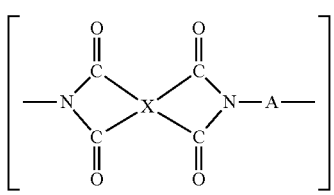

Formula (1)

In Formula (1), X represents a tetracarboxylic acid residue obtained by removing a carboxy group from a tetracarboxylic acid, and A represents a diamine residue obtained by removing an amino group from a diamine.

In Formula (1), X is preferably formed of at least one kind of group selected from the group consisting of the groups represented by Formulas (X1) to (X4) below.

[Chem. 2]

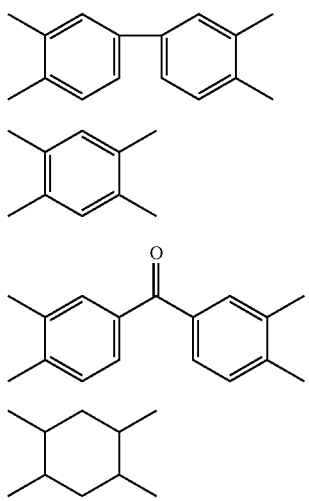

Formula (X1)

Formula (X2)

Formula (X3)

Formula (X4)

Among these, in terms of excellent heat resistance of the polyimide resin, 50 mol % or more (preferably 80 to 100 mol %) of the total number of X is more preferably at least one kind of group selected from a group consisting of the groups represented by the following Formulas (X1) to (X4). It is even more preferable that substantially all of the total number of X (100 mol %) is formed of at least one kind of group selected from the group consisting of the groups represented by the above Formulas (X1) to (X4).

In addition, A represents a diamine residue obtained by removing an amino group from a diamine and is preferably formed of at least one kind of group selected from the group consisting of the groups represented by the following Formulas (A1) to (A8).

Among these, in terms of excellent heat resistance of the polyimide resin, 50 mol % or more (preferably 80 to 100 mol %) of the total number of A is more preferably at least one kind of group selected from a group consisting of groups represented by the following Formulas (A1) to (A8). It is even more preferable that substantially all of the total number of A (100 mol %) is formed of at least one kind of group selected from a group consisting of the groups represented by the following Formulas (A1) to (A8).

[Chem. 3]

Formula (A1)

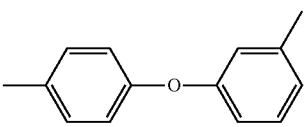

Formula (A2)

Formula (A3)

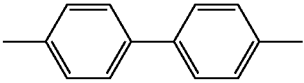

Formula (A4)

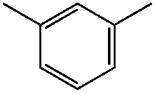

Formula (A5)

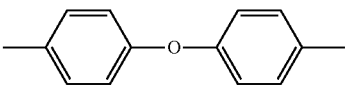

Formula (A6)

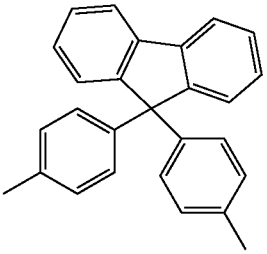

Formula (A7)

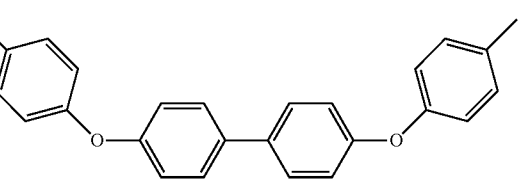

Formula (A8)

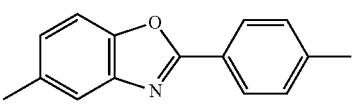

It is also possible to use the polyimide shown above not only as an organic layer, but also as a second substrate (substrate 116).

The thickness of the organic layer is not particularly limited, but it is preferably 1 to 100 μm, more preferably 5 to 30 μm, and even more preferably 7 to 20 μm. This is because when the thickness of the organic layer is in such a range, adhesion between the organic layer and the first glass substrate or the substrate is sufficient.

(Inorganic Layer)

The material constituting the inorganic layer is not particularly limited, but it is preferable to include, for example, at least one selected from a group consisting of oxides, nitrides, oxynitrides, carbides, carbonitrides, silicides, and fluorides. Among these, it is preferable to include an oxide in terms of the peelability of the substrate 16 being superior.

Examples of oxides (preferably metal oxides), nitrides (preferably metal nitrides) and oxynitrides (preferably metal oxynitrides) include oxides, nitrides and oxynitrides of one or more kinds of elements selected from Si, Hf, Zr, Ta, Ti, Y, Nb, Na, Co, Al, Zn, Pb, Mg, Bi, La, Ce, Pr, Sm, Eu, Gd, Dy, Er, Sr, Sn, In, and Ba.

More specifically, examples thereof include a silicon nitride oxide ($SiN_xO_y$), titanium oxide ($TiO_2$), indium oxide ($In_2O_3$), indium cerium oxide (ICO), tin oxide ($SnO_2$), zinc oxide (ZnO), gallium oxide ($Ga_2O_3$), indium tin oxide (ITO), indium zinc oxide (IZO), zinc tin oxide (ZTO), gallium added zinc oxide (GZO), and the like.

Examples of carbides (preferably metal carbides) and carbonitrides (preferably metal carbonitrides) include carbides, carbonitrides and carbonates of one or more kinds of elements selected from Ti, W, Si, Zr, and Nb. Examples thereof include silicon carbide oxide (SiCO), and the like.

The carbide may be a so-called carbon material, and may be a carbide obtained by sintering a resin component such as a phenol resin, for example.

Examples of silicide (preferably metal silicide) include silicide of one or more kinds of elements selected from Mo, W and Cr.

Examples of fluorides (preferably, metal fluorides) include fluorides of one or more kinds of elements selected from Mg, Y, La, and Ba. For example, examples thereof include magnesium fluoride ($MgF_2$) and the like.

The thickness of the inorganic layer is not particularly limited, but is preferably 5 to 5000 nm, and more preferably 10 to 500 nm from the viewpoint that the effect of the present invention is superior.

The surface roughness (Ra) of the surface of the inorganic layer in contact with the substrate 16 is preferably 2.0 nm or less, and more preferably 1.0 nm or less. The lower limit value is not particularly limited, but 0 is the most preferable. Within the range described above, adhesion with the substrate 16 is further improved, it is possible to further suppress positional shifting of the substrate 16 and the like, and the substrate 16 is also excellent in peelability.

Ra is measured in accordance with JIS B 0601 (revised 2001).

<Method for Manufacturing Carrier Substrate and Laminate>

The method for manufacturing the laminate 100 of the first embodiment of the present invention is not particularly limited and it is possible to adopt a known method, but in general, it includes an adhesive layer forming step of forming the adhesive layer 14 on the first glass substrate 12, and a laminating step of laminating the substrate 16 on the adhesive layer 14 to obtain the laminate 100. Here, the adhesive layer forming step described above corresponds to a carrier substrate manufacturing step.

Here, a detailed description will be given of the adhesive layer forming step and the laminating step.

(Adhesive Layer Forming Step)

The adhesive layer forming step is a step of forming the adhesive layer 14 on the first glass substrate 12. The method for forming the adhesive layer 14 is not particularly limited, and it is possible to adopt a known method, which varies depending on the type of the material constituting the adhesive layer 14.

For example, in a case where the adhesive layer 14 is an organic layer, examples of methods for preparing the organic layer include a method (coating method) of coating a curable resin composition which includes a curable resin onto the first glass substrate 12 and curing the curable resin composition to form the adhesive layer 14 fixed on the first glass substrate 12, a method (attachment method) of fixing a film shaped adhesive layer 14 to the surface of the first glass substrate 12, or the like. Among others, the coating method is preferable in terms of the adhesion strength of the adhesive layer 14 to the first glass substrate 12 being superior.

In the coating method, examples of a method for forming the curable resin composition layer on the surface of the first glass substrate 12 include methods of coating curable resin compositions on a glass substrate. Examples of coating methods include a spray coating method, a die coating method, a spin coating method, a dip coating method, a roll coating method, a bar coating method, a screen printing method, a gravure coating method, and the like.

The curing method is not particularly limited, and the optimum curing conditions are selected depending on the resin to be used. Usually, as a curing method, a heat treatment is employed.

Here, in addition to the above, an organic layer may be prepared by a known method.

For example, the method for preparing an adhesive layer that includes a fluorine-based resin is not particularly limited and examples thereof include a method of preparing an adhesive layer by using a composition including a fluorine-based resin or a method of preparing an adhesive layer on the surface of the object by irradiating with a plasma using a fluorine-based gas.

In addition, in a case where the adhesive layer 14 is an inorganic layer, it is possible to adopt a known method as a method for manufacturing the inorganic layer. Examples thereof include a method of providing an inorganic layer formed of predetermined components on the first glass substrate 12 by, for example, a vapor deposition method, a sputtering method or a CVD method. The inorganic layer obtained by the above method is fixed on the first glass substrate 12 and the exposed surface of the inorganic layer is able to be peelably adhered to the substrate 16.

Examples of a method of preparing an inorganic layer formed of a carbide (carbon material) include a method of coating a resin composition including a resin component such as a phenol resin on the first glass substrate 12 and carrying out a sintering process to perform carbonization.

Regarding manufacturing conditions, the optimum conditions are appropriately selected according to the material to be used.

(Laminating Step)

In the laminating step, the substrate 16 is laminated on the surface of the adhesive layer 14 obtained in the adhesive layer forming step described above to obtain the laminate 100 provided with the first glass substrate 12, the adhesive layer 14, and the substrate 16 in this order.

The method of laminating the substrate 16 on the adhesive layer 14 is not particularly limited, and it is possible to adopt a known method.

Example thereof include a method in which the substrate 16 is laminated on the surface of the adhesive layer 14 in a normal pressure environment. Here, as necessary, after laminating the substrate 16 on the surface of the adhesive layer 14, the substrate 16 may be pressure-bonded to the adhesive layer 14 by using a roll or a press. Bubbles inserted between the adhesive layer 14 and the layer of the substrate 16 are comparatively easily removed by pressure bonding by rolling or pressing, which is preferable.

Press bonding by a vacuum lamination method or a vacuum press method is more preferable because the insertion of bubbles is suppressed and good adhesion is secured. By pressure bonding under vacuum, even in a case where minute bubbles remain, the heating does not cause the bubbles to grow and there is also an advantage in that distortion defects of the substrate 16 are not easily generated.

When laminating the substrate 16, it is preferable to sufficiently wash the surface of the substrate 16 in contact with the adhesive layer 14 and carry out lamination in an environment with high cleanness. The higher the degree of cleanness, the better the flatness of the substrate 16, which is preferable.

Here, after laminating the substrates 16, a pre-annealing treatment (a heat treatment) may be carried out as necessary. By performing the pre-annealing treatment, the adhesion of the laminated substrate 16 to the adhesive layer 14 is improved and it is possible to obtain an appropriate peel strength (y) and, during the member forming step described below, positional shifting or the like of the member for an electronic device is unlikely to occur, and the productivity of the electronic device is improved.

(Laminate)

The laminate of the present invention (the laminate 100 of the first embodiment and the laminate 110 of the second embodiment described above) are able to be used for various purposes, and example thereof includes a purpose for manufacturing display device panels, PV, thin film secondary batteries, or electronic components such as a semiconductor wafer on which a circuit is formed on a surface, and the like. Here, in such a purpose, the laminate 100 is exposed (for example, for 20 minutes or more) to high temperature conditions (for example, 500° C. or more) in many cases. In other words, in many cases, a step having a process temperature of 500° C. or more is included when forming an electronic device.

Here, display device panels include an LCD, an OLED, electronic paper, a plasma display panel, a field emission panel, a quantum dot LED panel, a MEMS (Micro Electro Mechanical Systems) shutter panel, and the like.

<Electronic Device and Manufacturing Method Thereof>

In the present invention, an electronic device (also referred to below as "a member-attached-substrate" as appropriate) including a substrate and a member for an electronic device is manufactured by using the laminate described above.

A detailed description will be given below of a method for manufacturing an electronic device using the laminate having an adhesive layer described above.

The method for manufacturing an electronic device is not particularly limited, but from the viewpoint of excellent productivity of the electronic device, a method of manufacturing a member for an electronic device-attached-laminate by forming a member for an electronic device on the substrate in the laminate and separating an electronic device (a member-attached-substrate) and a carrier substrate from the obtained member for an electronic device-attached-laminate, with the substrate side interface of the adhesive layer as a peeling surface, is preferable.

The step of forming a member for an electronic device on a substrate in the laminate to manufacture a member for an electronic device-attached-laminate will be referred to below as a member forming step, and a step of separating a member-attached-substrate and the carrier substrate from the member for an electronic device-attached-laminate, with the substrate side interface of the adhesive layer as a peeling surface, will be referred to as a separating step.

A detailed description will be given below of the materials used in each step and the order thereof.

(Member Forming Step)

The member forming step is a step of forming a member for an electronic device on the substrate 16 in the laminate 100 obtained in the laminating step. More specifically, as illustrated in (A) of FIG. 4, a member for an electronic device 20 is formed on the second main surface 16b (exposed surface) of the substrate 16 to obtain a member for an electronic device-attached-laminate 22.

First, a detailed description will be given of the member for an electronic device 20 used in this step, and then a detailed description will be given of the order of steps.

(Member for Electronic Device (Functional Element))

The member for an electronic device 20 is a member formed on the substrate 16 in the laminate 100 and constituting at least a part of the electronic device. More specifically, examples of the member for an electronic device 20 include display device panels, solar cells, thin film secondary batteries, or members used for an electronic component such as a semiconductor wafer on which a circuit is formed on the surface (for example, a member for a display device, a member for a solar cell, a member for a thin film secondary battery, and a circuit for an electronic component).

Examples of members for solar cell include, in silicon type ones, a transparent electrode such as a tin oxide of a positive electrode, a silicon layer represented by a p layer/i layer/n layer, a metal of a negative electrode, and the like, and other examples include various types of member corresponding to compound types, dye sensitization types, quantum dot types, and the like.

In addition, examples of a member for a thin film secondary battery include, in lithium ion type ones, transparent electrodes such as a metal or a metal oxide of a positive electrode and negative electrode, a lithium compound of an electrolyte layer, a metal of a current collecting layer, a resin as a sealing layer, and the like and other examples include various other members corresponding to nickel hydrogen types, polymer types, ceramic electrolyte types, and the like.

In addition, examples of circuits for electronic components include, for CCD and CMOS, metal conductive portions, silicon oxide or silicon nitride of insulating portions, and the like, and other examples include various sensors such as pressure sensors and acceleration sensors, various members corresponding to rigid printed substrates, flexible printed substrates, rigid flexible printed substrates, and the like.

Here, the member for an electronic device 20 preferably includes low-temperature polysilicon (LTPS). That is, in the present member forming step, it is preferable to include a step of manufacturing low-temperature polysilicon. In particular, it is more preferable that the present member forming step includes a step of manufacturing a thin film transistor including low-temperature polysilicon.

Low-temperature polysilicon is polysilicon obtained by applying crystallization energy by laser annealing, furnace annealing, or the like with using amorphous silicon as a precursor and crystallizing the silicon. In the process of manufacturing such low-temperature polysilicon, the amorphous silicon is heated to 450° C. or more in many cases, in other words, the process temperature is 450° C. or more in many cases.

In addition, in a case where the electronic device is an electronic display, the resolution of the display is preferably 300 ppi (pixels per inch) or more in terms of using the carrier glass of the present invention. It is more preferably 400 ppi or more, and even more preferably 500 ppi or more.

(Order of Steps)

The method for manufacturing the member for an electronic device-attached-laminate 22 described above is not particularly limited, and the member for an electronic device 20 is formed on the second main surface 16b of the substrate 16 of the laminate 100 by a conventionally known method according to the type of the component members of the member for an electronic device.

Here, the member for an electronic device 20 may not be the entirety of the member finally formed on the second main surface 16b of the substrate 16 (referred to below as "all members"), but may be a part of all of the members (referred to below as a "partial member"). It is also possible to make a partial member-attached-substrate peeled from the adhesive layer 14 to be an all members-attached-substrate (corresponding to an electronic device to be described below) in subsequent steps.

In addition, another member for an electronic device may be formed on the peeling surface (first main surface 16a) of the all members-attached-substrate peeled from the adhesive layer 14. In addition, it is also possible to manufacture an electronic device by assembling the all members-attached-laminate and then peeling the carrier substrate 10 from the all members-attached-laminate. Furthermore, it is also possible to manufacture a member-attached-substrate having two glass substrates by assembling two all members-attached-laminates and then peeling two carrier substrates 10 from the all members-attached-laminates.

For example, taking the case of manufacturing an OLED as an example, in order to form an organic EL structure on the surface (corresponding to the second main surface 16b of the substrate 16) of the substrate 16 of the laminate 100 opposite to the adhesive layer 14 side, various kinds of layer formations and treatments are carried out such as forming a transparent electrode, vapor-depositing a hole injecting layer, a hole transporting layer, a light emitting layer, an electron transporting layer, or the like on the surface on which the transparent electrode is formed, forming a back electrode, and sealing using a sealing plate. Specific examples of these layer formations and treatments include film formation treatments, vapor deposition treatments, adhesion treatment of a sealing plate, and the like.

In addition, for example, in the case of manufacturing a TFT-LCD, there are various types of steps such as a TFT forming step of forming a thin film transistor (TFT) by forming a pattern on a metal film, a metal oxide film, or the like formed by a typical film formation method such as a CVD method or a sputtering method using a resist solution on the second main surface 16b of the substrate 16 of the laminate 100, a CF forming step of forming a color filter (CF) by using a resist solution for pattern forming on the second main surface 16b of the substrate 16 of another laminate 100, a bonding step of laminating the TFT-attached-laminate obtained in the TFT forming step and the CF-attached-laminate obtained in the CF forming step, and the like.

In the TFT forming step and the CF forming step, the TFT and CF are formed on the second main surface 16b of the substrate 16 by using well-known photolithography techniques, etching techniques, or the like. Here, a resist solution is used as a coating solution for pattern formation.

The second main surface 16b of the substrate 16 may be cleaned before forming the TFT or the CF, if necessary. As a cleaning method, it is possible to use well-known dry cleaning or wet cleaning.

In the bonding step, the thin film transistor forming surface of the TFT-attached-laminate and the color filter forming surface of the CF-attached-laminate are made to face each other and bonded together by using a sealing agent (for example, an ultraviolet curable sealant for cell formation). Thereafter, the liquid crystal material is injected into the cell formed by the TFT-attached-laminate and the CF-attached-laminate. Examples of a method for injecting the liquid crystal material include a reduced pressure injection method and a dropping injection method.

(Separating Step)

Figure 4:
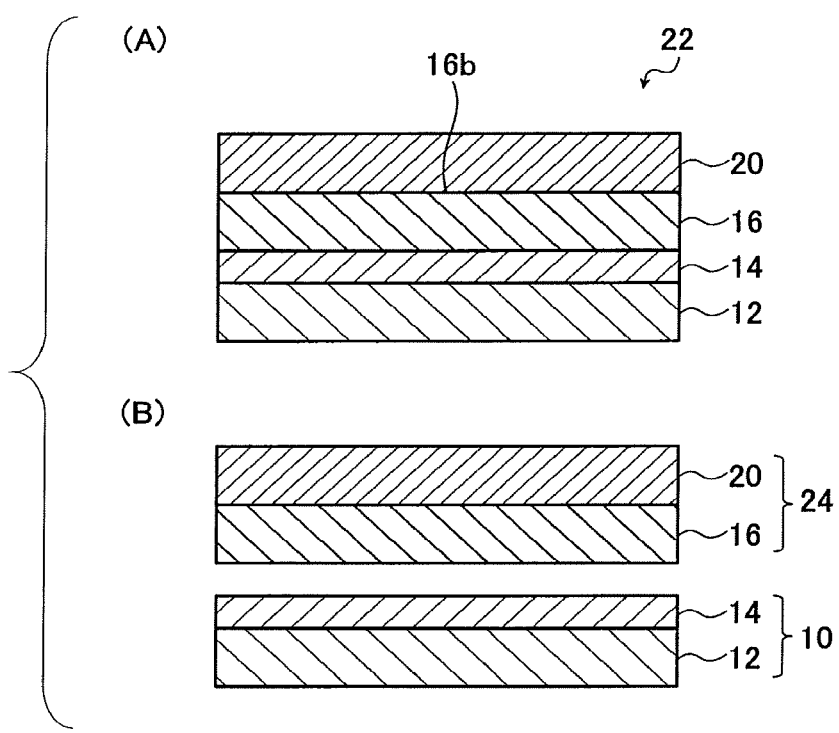
FIG. 4 (A) of FIG. 4 and (B) of FIG. 4 are schematic cross-sectional views illustrating an embodiment of a method for manufacturing a member-attached-substrate according to the present invention in order of steps. (A) of FIG. 4 is a schematic cross-sectional view of a member for an electronic device-attached-laminate 22 obtained in a member forming step, and (B) of FIG. 4 is a schematic cross-sectional view of a member-attached-substrate 24 obtained in a separating step and a carrier substrate 10.

As illustrated in (B) of FIG. 4, the separating step is a step of separating the substrate 16 (member-attached-substrate) on which the member for an electronic device 20 is laminated and the carrier substrate 10 from the member for an electronic device-attached-laminate 22 obtained in the member forming step, with the interface between the adhesive layer 14 and the substrate 16 as the peeling surface, so as to obtain a member-attached-substrate (electronic device) 24 including the member for an electronic device 20 and the substrate 16.

In a case where the member for an electronic device 20 on the substrate 16 at the time of peeling is a part of the formation of all the component members needed, it is also possible to form the remaining component members on the substrate 16 after separation.

The method of peeling the substrate 16 and the carrier substrate 10 is not particularly limited. Specifically, for example, it is possible to insert a sharp cutter-like object into the interface between the substrate 16 and the adhesive layer 14 to give a peeling trigger, and then a mixed fluid of water and compressed air is blown therein to carry out the peeling.

Preferably, the member for an electronic device-attached-laminate 22 is placed on a platen with the carrier substrate 10 thereof being on the upper side and the member for an electronic device 20 side being on the lower side, the member for an electronic device 20 side is vacuum adsorbed on the platen (in a case where the carrier substrates are laminated on both sides, this is carried out sequentially), and, in this state, the cutter first enters into the interface between the substrate 16 and the adhesive layer 14. Thereafter, the carrier substrate 10 side is adsorbed by a plurality of vacuum suction pads, and the vacuum suction pads are raised in order from the vicinity of the place where the cutter is inserted. Then, an air layer is formed at the interface between the adhesive layer 14 and the substrate 16 or on a cohesive failure surface of the adhesive layer 14, and the air layer spreads over the interface or the entire face of the cohesive failure surface, so that it is possible to easily peel the carrier substrate 10.

In addition, it is possible to laminate the carrier substrate 10 with a new glass substrate to manufacture the laminate 100 of the present invention.

Here, when separating the member-attached-substrate 24 from the member for an electronic device-attached-laminate 22, controlling the spraying by the ionizer and the humidity makes it possible to further suppress the fragments of the adhesive layer 14 from being electrostatically attracted to the member-attached-substrate 24.

The method for manufacturing the member-attached-substrate 24 described above is suitable for manufacturing a small-sized display device used for a mobile terminal such as a mobile phone or a PDA. The display device is mainly an LCD or OLED, and LCDs include TN type, STN type, FE type, TFT type, MIM type, IPS type, VA type, and the like. Basically, it can be applied to either case of display devices of passive drive type or active drive type.

Examples of the member-attached-substrate 24 manufactured by the method described above include a panel for a display device having a glass substrate and a member for a display device, a solar cell having a glass substrate and a member for a solar cell, a thin film secondary battery having a glass substrate and a member for a thin film secondary battery, an electronic part having a glass substrate and a member for an electronic device, and the like. The panel for a display device includes a liquid crystal panel, an organic EL panel, a plasma display panel, a field emission panel, and the like.

Examples

A detailed description will be given below of the present invention with reference to Examples and the like, but the present invention is not limited by these examples.

In the following Examples and Comparative Examples, the first glass substrates 1 to 12 manufactured in the following order were used. The first glass substrates 5, 6 and 9 are Examples, and the first glass substrates 1 to 4, 7, 8, and 10 to 12 are Comparative Examples.

(Manufacture of First Glass Substrate)

Table 1 is a table showing the compaction and the like of glass substrates having 12 compositions. Materials for each component were prepared to have the target compositions shown below and dissolved at a temperature of 1500° C. to 1600° C. by using a platinum crucible to obtain molten glass. During the dissolution, the glass was homogenized by stirring using a platinum stirrer. Next, the molten glass was poured out, formed into a plate shape having a plate thickness of 0.3 mm, and then gradually cooled to manufacture a first glass substrate. Here, as the gradual cooling conditions, cooling was performed at an average cooling rate (° C./min) described in Table 1.

The Young's modulus was measured by an ultrasonic pulse method on a glass having a thickness of 0.5 to 10 mm according to the method set out in JIS Z 2280 (1993).

According to JIS-Z 2244; 2009, the Vickers hardness was measured by using MVK-H100 manufactured by Akashi, with a test force of 0.9807 N and a pushing time of 15 seconds.

For the ultraviolet transmittance, the transmittance at a wavelength of 300 nm was measured on a glass of 0.5 mm thickness optically polished on both sides, by using an ultraviolet-visible-near-infrared spectrophotometer U4100 manufactured by Hitachi High-Tech Science Corporation.

Measurement of the strain point was carried out by the method described above.

In addition, the compaction in the table described above shows the compaction (shrinkage) in a case where the temperature is raised from room temperature at 100° C./hour, heat treatment is performed at 600° C. for 80 minutes, and cooling to room temperature is performed at 100° C./hour. This shows calculated values obtained by the method described below, but the measurement values measured by the method described above were also almost the same as the calculated values in the above table.

(Calculation Method of Compaction)

The calculation of compaction C was obtained by using the following formula that expresses the structural relaxation of glass and by making minute temperature changes and performing successive calculations. As the various parameters ($\beta$, $\tau$), ones obtained by actual measurement using the glass of the composition were used.

$$(V)(\xi)-V_0)/(V_\infty-V_0)=\exp[-(\xi/\tau)^\beta]$$

$$C=10^6 \times \Delta L/L = 10^6 \times [1-(V(\xi)/V_0)^{1/3}]$$

Here, $V_0$ is a molar volume of the glass at processing time 0, $V_\infty$ is an equilibrium molar volume at the treatment temperature, $V(\xi)$ is a molar volume of the glass at a conversion time $\xi$, C is the compaction (unit: ppm), L is the glass length, $\Delta L$ is a change amount of the glass length before and after treatment, $\tau$ is a relaxation time constant, and $\beta$ is a parameter showing a spread of the relaxation time constant.

(Measurement of Compaction of Glass Substrate During a Plurality of Times of Heat Treatment)

Table 2 is a table showing the results of measurement of compaction when subjecting the glass substrate of Table 1 to a plurality of times (three times) of heat treatment. By using the first glass substrates 1 to 12, the compaction of the glass substrate was calculated after each heat treatment when the heat treatment under the following heating conditions was performed a plurality of times. The column of "first time" shows the compaction (ppm) of the glass substrate after performing the following heat treatment once. The column of "second time" shows the compaction after the glass substrate subjected to the first heat treatment was cooled to room temperature and then subjected to the second heat treatment. The column of "third time" shows the compaction

TABLE 1

|  |  | Number of First Glass Substrate | | | | | | | | | | | |
|---|---|---|---|---|---|---|---|---|---|---|---|---|---|
|  |  | 1 | 2 | 3 | 4 | 5 | 6 | 7 | 8 | 9 | 10 | 11 | 12 |
| Composition (mass %) | SiO$_2$ | 59.6 | 59.6 | 59.6 | 59.6 | 62.1 | 62.1 | 62.1 | 62.1 | 61.3 | 61.3 | 61.3 | 61.3 |
|  | Al$_2$O$_3$ | 17.2 | 17.2 | 17.2 | 17.2 | 19.0 | 19.0 | 19.0 | 19.0 | 19.8 | 19.8 | 19.8 | 19.8 |
|  | B$_2$O$_3$ | 7.7 | 7.7 | 7.7 | 7.7 | 2.6 | 2.6 | 2.6 | 2.6 | 1.3 | 1.3 | 1.3 | 1.3 |
|  | MgO | 3.3 | 3.3 | 3.3 | 3.3 | 2.0 | 2.0 | 2.0 | 2.0 | 5.6 | 5.6 | 5.6 | 5.6 |
|  | CaO | 4.1 | 4.1 | 4.1 | 4.1 | 4.1 | 4.1 | 4.1 | 4.1 | 4.6 | 4.6 | 4.6 | 4.6 |
|  | SrO | 7.7 | 7.7 | 7.7 | 7.7 | 2.3 | 2.3 | 2.3 | 2.3 | 6.9 | 6.9 | 6.9 | 6.9 |
|  | BaO | 0.1 | 0.1 | 0.1 | 0.1 | 7.6 | 7.6 | 7.6 | 7.6 | 0.1 | 0.1 | 0.1 | 0.1 |
|  | MgO + CaO + SrO + BaO | 15.1 | 15.1 | 15.1 | 15.1 | 16.0 | 16.0 | 16.0 | 16.0 | 17.1 | 17.1 | 17.1 | 17.1 |
| Manufacturing conditions | Average Cooling Rate (° C./min) | 50 | 300 | 400 | 500 | 50 | 300 | 400 | 500 | 50 | 300 | 400 | 500 |
| Physical property values | Strain point (° C.) | 670 | 670 | 670 | 670 | 733 | 733 | 733 | 733 | 715 | 715 | 715 | 715 |
|  | Compaction (ppm) | 164 | 272 | 291 | 306 | 44 | 77 | 83 | 88 | 46 | 81 | 87 | 92 |
|  | Young's Modulus (GPa) | 77 | 77 | 77 | 77 | 78 | 78 | 78 | 78 | 85 | 85 | 85 | 85 |
|  | Vickers hardness | 570 | 570 | 570 | 570 | 590 | 590 | 590 | 590 | 620 | 620 | 620 | 620 |
|  | Transmittance (300 nm) (%) (plate thickness 0.5 mm) | 40 | 40 | 40 | 40 | 70 | 70 | 70 | 70 | 70 | 70 | 70 | 70 | after the glass substrate subjected to the second heat treatment was cooled to room temperature and then subjected to the third heat treatment.
(Heat Treatment)

The glass substrate was subjected to temperature raising from room temperature to 450° C. in 5 minutes, held at 450° C. for 20 minutes, and then cooled to room temperature in 5 minutes, and furthermore, the glass substrate was subjected to temperature raising from room temperature to 600° C. in 5 minutes, held at 600° C. for 5 minutes, and then cooled to room temperature in 5 minutes.

As shown in Table 2, in a case where the first glass substrate was 1 to 4, since the "compaction (ppm) at 600° C. for 80 minutes" in Table 1 was as large as 150 ppm or more, the compaction value in the electronic device forming step was 10 ppm or more and the difference $\Delta C_{2-1}$ between the compaction value at the initial heat treatment and the compaction value at the second heat treatment was 10 ppm or more, which is a great change, in all cases, which was not suitable as the substrate. In addition, in Table 1, in a case where the "compaction (ppm) at 600° C. for 80 minutes" was 80 ppm or less (first glass substrates 5, 6 and 9), it was confirmed that the difference $\Delta C_{2-1}$ between the compaction value at the initial heat treatment and the compaction value at the second heat treatment and the difference $\Delta C_{3-2}$ between the compaction value at the second heat treatment and that at the third heat treatment were both as small as 6 ppm or less.
(Manufacture of Electronic Device)

Alkenyl group-containing organopolysiloxane (number average molecular weight: 2000, number of alkenyl groups: 2 or more) (100 parts by mass) and hydrogen polysiloxane (number average molecular weight: 2000, number of hydrosilyl groups: 2 or more) (6.7 parts by mass) were blended. Here, the blending molar ratio (number of moles of hydrosilyl group/number of moles of alkenyl group) of the alkenyl groups in the alkenyl group-containing organopolysiloxane and the hydrosilyl groups in the hydrogen polysiloxane was 0.4/1. Furthermore, a catalyst (platinum catalyst) was added in an amount of 300 ppm based on the total mass (100 parts by mass) of the alkenyl group-containing organopolysiloxane and the hydrogen polysiloxane. This solution is referred to as curable resin composition X. This curable resin composition X was coated on the first main surface of the first glass substrate 1 by using a die coater to provide a layer including the uncured alkenyl group-containing organopolysiloxane and hydrogen polysiloxane on the first glass substrate 1.

Next, after heating in the air at 140° C. for 3 minutes, curing was carried out by heating in air at 230° C. for 20 minutes to form a silicone resin layer with a thickness of 10 μm on the first main surface of the first glass substrate 1. The flatness of the silicone resin layer was good.

Thereafter, the second glass substrate and the silicone resin layer surface were bonded together by vacuum pressing at room temperature to obtain a glass laminate A.

Here, a glass plate (length 200 mm, width 200 mm, plate thickness 0.2 mm, linear expansion coefficient $38 \times 10^{-7}/°$ C., trade name "AN 100" manufactured by Asahi Glass Company, Ltd.) formed of alkali-free borosilicate glass was used as the second glass substrate.

In the obtained glass laminate A, the first glass substrate and the second glass substrate were in close contact with the silicone resin layer without generating bubbles, and there were no distortion defects. In addition, in the glass laminate A, the peel strength at the interface between the silicone resin layer and the layer of the first glass substrate was greater than the peel strength at the interface between the layer of the second glass substrate and the silicone resin layer.

Next, an electronic device was manufactured on the second glass substrate of the glass laminate A according to the following method.

As the electronic device manufacturing method, an LTPS process using an excimer laser annealing method was used. First, a protective layer was formed on the second glass substrate, and then a film of amorphous silicon was formed. A dehydrogenating step, laser irradiation, and an activating step were performed, various wirings such as a gate electrode, and a source and a drain electrodes were formed and patterned, and an interlayer insulating film or the like was formed to form a thin film transistor circuit.

Here, a step with a manufacturing process temperature of 500° C. or more was included in the manufacturing steps of the electronic device.

Then, while a stainless-steel cutter having a thickness of 0.1 mm was inserted into the interface between the second glass substrate and the silicone resin layer at one corner portion of four corner portions of the glass laminate A on which the electronic device was manufactured, to form peeling cutaway portion, a vacuum suction pad was adsorbed to a surface which is not a peeling surface of the first glass substrate and an external force was applied in a direction in which the carrier substrate and the electronic device (member for an electronic device-attached-second glass) separate from each other so as to separate the carrier substrate and the electronic device without breaking. Here, the cutter was inserted while spraying static eliminating fluid from an ionizer (manufactured by Keyence Corporation) onto the interface. Specifically, the vacuum suction pad was pulled up while continuously spraying the static elimination fluid from the ionizer toward the formed gap.

Here, the silicone resin layer was separated from the second glass substrate with the first glass substrate and, from the results, it was confirmed that the peel strength (x) at the interface between the layer of the first glass substrate and the silicone resin layer was higher than the peel strength (y) at the interface between the silicone resin layer and the second glass substrate.

Next, by using the recovered carrier substrate, the glass laminate A was manufactured according to the same procedure as described above, and an electronic device was manufactured in accordance with the same procedure as described above.

This process was repeated twice to manufacture electronic devices.

Here, a plurality of glass laminates A were prepared and each of the above treatments was carried out.
(Evaluation (Productivity))

A case where the manufacturing yield of the electronic device at the second and third use of the carrier substrate was equivalent to the first time was "A", a case where the manufacturing yield was reduced, but fell within a practically acceptable range was "B", and a case where the manufacturing yield dropped greatly and was not acceptable for practical use was "C".

The (Evaluation (Productivity)) described above was carried out according to the above procedure by using the first glass substrates 2 to 12 in place of the first glass substrate 1.

TABLE 2

|  | Compaction (ppm) at 600° C. for 80 min | Compaction | | | Pro-ductivity |
|---|---|---|---|---|---|
|  |  | First time | Second time | Third time |  |
| First glass substrate 1 | 164 | 17.8 | 14.6 | 12.5 | C |
| First glass substrate 2 | 272 | 42.7 | 26.4 | 21.6 | C |
| First glass substrate 3 | 291 | 47.7 | 28.5 | 23.2 | C |
| First glass substrate 4 | 306 | 51.8 | 30.3 | 24.5 | C |
| First glass substrate 5 | 44 | 4.6 | 3.5 | 2.9 | A |
| First glass substrate 6 | 77 | 12.8 | 6.8 | 5.3 | B |
| First glass substrate 7 | 83 | 14.5 | 7.4 | 5.8 | C |
| First glass substrate 8 | 88 | 15.9 | 7.9 | 6.1 | C |
| First glass substrate 9 | 46 | 4.6 | 3.6 | 3.0 | A |
| First glass substrate 10 | 81 | 14.1 | 7.2 | 5.5 | C |
| First glass substrate 11 | 87 | 16.1 | 7.8 | 6.0 | C |
| First glass substrate 12 | 92 | 17.7 | 8.3 | 6.3 | C |

As shown in the above Table 2, it was confirmed that excellent effects were able to be obtained in a case where the first glass substrates 5, 6 and 9 having compaction (ppm) of 80 ppm or less are used. In particular, it was confirmed that the effect was superior in a case where the compaction was 70 ppm or less.

While the present invention has been described in detail and with reference to specific embodiments thereof, it will be apparent to one skilled in the art that various changes and modifications can be made therein without departing from the intention and scope of the present invention. The present application is based on a Japanese patent application filed on Jul. 3, 2015 (Application No. 2015-134697), the whole thereof being incorporated herein by reference.

REFERENCE SIGNS LIST

10 CARRIER SUBSTRATE
12, 112 FIRST GLASS SUBSTRATE
14 ADHESIVE LAYER
16, 116 SUBSTRATE
20 MEMBER FOR ELECTRONIC DEVICE
22 MEMBER FOR ELECTRONIC DEVICE-ATTACHED-LAMINATE
24 MEMBER-ATTACHED-SUBSTRATE (ELECTRONIC DEVICE)
100, 110 LAMINATE

The invention claimed is:

1. A carrier substrate for manufacturing a member for an electronic device on a surface of a substrate by bonding the carrier substrate to the substrate, the carrier substrate comprising:
a first glass substrate,
wherein the first glass substrate has a compaction of 80 ppm or less, wherein the compaction is determined as a shrinkage when subjecting the first glass substrate to a temperature raising from a room temperature at 100° C./hour and to a heat treatment at 600° C. for 80 minutes, and then to a cooling to the room temperature at 100° C./hour,
wherein the first glass substrate comprises a glass comprising, in terms of mass percentages based on oxides, the following:
$SiO_2$: 50% to 62.1%,
$Al_2O_3$: 19% to 22%,
$B_2O_3$: 0.1% to 3%,
MgO: 0% to 10%,
CaO: 4.1% to 14.5%,
SrO: 1% to 9%,
BaO: 0.1% to 7.6%, and
MgO+CaO+SrO+BaO: 8% to 29.5%.

2. The carrier substrate according to claim 1, wherein the compaction is 70 ppm or less.

3. The carrier substrate according to claim 1, wherein the first glass substrate has a strain point of 700° C. or more.

4. The carrier substrate according to claim 1, further comprising an adhesive layer arranged on the first glass substrate.

5. The carrier substrate of claim 1, wherein an external transmittance of the first glass substrate of 300 nm is 50% or more.

6. The carrier substrate of claim 1, wherein Vickers hardness of the first glass substrate is 580 or higher.

7. The carrier substrate of claim 1, wherein the glass of the first glass substrate comprises from 4.1 mass % to 7 mass % of CaO.

8. A laminate comprising:
the carrier substrate according to claim 1; and
the substrate arranged on the carrier substrate.

9. The laminate according to claim 8, wherein the substrate is a second glass substrate.

10. A method for manufacturing an electronic device, the method comprising:
forming a member for an electronic device on a surface of the substrate of the laminate according to claim 8 to obtain a member for an electronic device-attached-laminate; and
removing the carrier substrate from the member for an electronic device-attached-laminate to obtain an electronic device having the substrate and the member for an electronic device.

11. The method for manufacturing an electronic device according to claim 10, wherein the member for an electronic device comprises a low-temperature polysilicon (LTPS).

12. The method for manufacturing an electronic device according to claim 11, wherein in the forming of the member for an electronic device a temperature is 450° C. or more.

13. A carrier substrate for manufacturing a member for an electronic device on a surface of a substrate by bonding the carrier substrate to the substrate, the carrier substrate comprising:
a first glass substrate,
wherein the first glass substrate has a compaction of 80 ppm or less, wherein the compaction is determined as a shrinkage when subjecting the first glass substrate to a temperature raising from a room temperature at 100° C./hour and to a heat treatment at 600° C. for 80 minutes, and then to a cooling to the room temperature at 100° C./hour,
wherein the first glass substrate comprises a glass comprising, in terms of mass percentages based on oxides, the following:
$SiO_2$: 50% to 62.1%,
$Al_2O_3$: 19% to 22%,
$B_2O_3$: 0.1% to 5%,
MgO: 0% to 6%,
CaO: 4.1% to 14.5%,
SrO: 2.3% to 24%,
BaO: 0.1% to 5%, and
MgO+CaO+SrO+BaO: 8% to 29.5%.

14. The carrier substrate of claim 13, wherein Vickers hardness of the first glass substrate is 580 or higher.

15. The carrier substrate of claim 13, wherein the glass of the first glass substrate comprises from 4.1 mass % to 7 mass % of CaO.

16. The carrier substrate according to claim 13, wherein the first glass substrate has a strain point of 700° C. or more.

17. The carrier substrate of claim 13, wherein the glass comprises, in terms of mass percentages based on oxides, 57% to 62.1% of $SiO_2$.

18. The carrier substrate of claim 13, wherein the glass comprises, in terms of mass percentages based on oxides, 2.3% to 9% of SrO.

19. A laminate comprising:
the carrier substrate according to claim 13; and
the substrate arranged on the carrier substrate.

20. The laminate according to claim 19, wherein the substrate is a second glass substrate.

21. A carrier substrate for manufacturing a member for an electronic device on a surface of a substrate by bonding the carrier substrate to the substrate, the carrier substrate comprising:
a first glass substrate,
wherein the first glass substrate has a compaction of 80 ppm or less, wherein the compaction is determined as a shrinkage when subjecting the first glass substrate to a temperature raising from a room temperature at 100° C./hour and to a heat treatment at 600° C. for 80 minutes, and then to a cooling to the room temperature at 100° C./hour,
wherein the first glass substrate comprises a glass comprising, in terms of mass percentages based on oxides, the following:
$SiO_2$: 50% to 62.1%,
$Al_2O_3$: 19% to 22%,
$B_2O_3$: 0.1% to 3%,
MgO: 0% to 10%,
CaO: 4.1% to 14.5%,
SrO: 2.3% to 24%,
BaO: 0.1% to 7.6%, and
MgO+CaO+SrO+BaO: 8% to 29.5%.

22. The carrier substrate of claim 21, wherein an external transmittance of the first glass substrate of 300 nm is 50% or more.

23. The carrier substrate of claim 21, wherein Vickers hardness of the first glass substrate is 580 or higher.

24. The carrier substrate of claim 21, wherein the glass of the first glass substrate comprises from 4.1 mass % to 7 mass % of CaO.

25. The carrier substrate according to claim 21, wherein the first glass substrate has a strain point of 700° C. or more.

26. The carrier substrate of claim 21, wherein the glass comprises, in terms of mass percentages based on oxides, 0.1% to 5% of BaO.

27. A laminate comprising:
the carrier substrate according to claim 21; and
the substrate arranged on the carrier substrate.

28. The laminate according to claim 27, wherein the substrate is a second glass substrate.

29. A carrier substrate for manufacturing a member for an electronic device on a surface of a substrate by bonding the carrier substrate to the substrate, the carrier substrate comprising:
a first glass substrate,
wherein the first glass substrate has a compaction of 80 ppm or less, wherein the compaction is determined as a shrinkage when subjecting the first glass substrate to a temperature raising from a room temperature at 100° C./hour and to a heat treatment at 600° C. for 80 minutes, and then to a cooling to the room temperature at 100° C./hour,
wherein the first glass substrate comprises a glass comprising, in terms of mass percentages based on oxides, the following:
$SiO_2$: 50% to 62.1%,
$Al_2O_3$: 19% to 22%,
$B_2O_3$: 0.1% to 5%,
MgO: 0% to 6%,
CaO: 4.1% to 14.5%,
SrO: 2.3% to 24%,
BaO: 0.1% to 5%, and
MgO+CaO+SrO+BaO: 8% to 29.5%,
wherein an external transmittance of the first glass substrate of 300 nm is 50% or more.

30. The carrier substrate of claim 29, wherein Vickers hardness of the first glass substrate is 580 or higher.

31. The carrier substrate of claim 29, wherein the glass of the first glass substrate comprises from 4.1 mass % to 7 mass % of CaO.

32. The carrier substrate according to claim 29, wherein the first glass substrate has a strain point of 700° C. or more.

33. The carrier substrate of claim 29, wherein the glass comprises, in terms of mass percentages based on oxides, 1% to 5% of BaO.

34. A laminate comprising:
the carrier substrate according to claim 29; and
the substrate arranged on the carrier substrate.

35. The laminate according to claim 34, wherein the substrate is a second glass substrate.

\* \* \* \* \*